(12) United States Patent
See et al.

(10) Patent No.: US 9,685,364 B2
(45) Date of Patent: Jun. 20, 2017

(54) SILICON-ON-INSULATOR INTEGRATED CIRCUIT DEVICES WITH BODY CONTACT STRUCTURES AND METHODS FOR FABRICATING THE SAME

(71) Applicant: GLOBALFOUNDRIES Singapore Pte. Ltd., Singapore (SG)

(72) Inventors: Guan Huei See, Singapore (SG); Rui Tze Toh, Singapore (SG); Shaoqiang Zhang, Singapore (SG); Purakh Raj Verma, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/478,211

(22) Filed: Sep. 5, 2014

(65) Prior Publication Data
US 2016/0071758 A1 Mar. 10, 2016

(51) Int. Cl.
| | |
|---|---|
| H01L 21/762 | (2006.01) |
| H01L 21/265 | (2006.01) |
| H01L 29/66 | (2006.01) |
| H01L 29/06 | (2006.01) |
| H01L 29/78 | (2006.01) |
| H01L 21/308 | (2006.01) |
| H01L 23/485 | (2006.01) |

(52) U.S. Cl.
CPC ...... *H01L 21/76229* (2013.01); *H01L 21/265* (2013.01); *H01L 21/3083* (2013.01); *H01L 21/76237* (2013.01); *H01L 29/0649* (2013.01); *H01L 29/0653* (2013.01); *H01L 29/66568* (2013.01); *H01L 29/78* (2013.01); *H01L 23/485* (2013.01)

(58) Field of Classification Search
CPC .......... H01L 21/76224; H01L 29/0649; H01L 29/66795
See application file for complete search history.

(56) References Cited

U.S. PATENT DOCUMENTS

| | | |
|---|---|---|
| 6,787,422 B2 | 9/2004 | Ang et al. |
| 2002/0089031 A1* | 7/2002 | Ang ................. H01L 29/78615 257/506 |

(Continued)

*Primary Examiner* — Fernando L Toledo
*Assistant Examiner* — Lawrence-Linh T Nguyen
(74) *Attorney, Agent, or Firm* — Lorenz & Kopf, LLP

(57) ABSTRACT

Silicon-on-insulator integrated circuits including body contact structures and methods for fabricating the same are disclosed. A method for fabricating a silicon-on-insulator integrated circuit includes filling a plurality of first and second shallow isolation trenches with an insulating material to form plurality of first and second shallow trench isolation (STI) structures, the plurality of second shallow isolation trenches having doped regions therebeneath, and forming a gate structure over the semiconductor layer that includes a first portion disposed over and parallel to at least two of the plurality of second STI structures and a second portion disposed in between the at least two of the plurality of second STI structures. The method further includes forming contact plugs to a body contact or gate region of the semiconductor layer. The body contact region includes a portion of the semiconductor layer between at least one of the plurality of first STI structures and at least one of the plurality of second STI structures.

17 Claims, 4 Drawing Sheets

(56) References Cited

U.S. PATENT DOCUMENTS

2007/0018273 A1\* 1/2007 Miller ............... H01L 21/82348
　　　　　　　　　　　　　　　　　　　　　　257/506
2010/0081239 A1　　 4/2010 Min et al.
2012/0056245 A1\* 3/2012 Kang ................. H01L 21/0245
　　　　　　　　　　　　　　　　　　　　　　257/192
2012/0267759 A1\* 10/2012 Shroff ................ H01L 27/0629
　　　　　　　　　　　　　　　　　　　　　　257/532

\* cited by examiner

SILICON-ON-INSULATOR INTEGRATED CIRCUIT DEVICES WITH BODY CONTACT STRUCTURES AND METHODS FOR FABRICATING THE SAME

TECHNICAL FIELD

The present disclosure generally relates to integrated circuits and methods for fabricating integrated circuits. More particularly, the present disclosure relates to silicon-on-insulator integrated circuit devices with body contact structures and methods for fabricating the same.

BACKGROUND

The majority of present day integrated circuits are implemented by using a plurality of interconnected field effect transistors (FETs), also called metal oxide semiconductor field effect transistors (MOSFETs), or simply MOS transistors. A MOS transistor includes a gate electrode as a control electrode and spaced apart source and drain regions between which a current can flow. A control voltage applied to the gate electrode controls the flow of current through a channel between the source and drain regions.

The fabrication of integrated circuits requires a large number of circuit elements, such as transistors and the like, to be formed on a given chip area according to a specified circuit layout. For fabricating complex integrated circuits, such as microprocessors, storage chips, ASICs (application specific ICs) and the like, CMOS technology is one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed above a substrate including a crystalline semiconductor layer. A MOS transistor, irrespective of whether an N-channel transistor or a P-channel transistor is considered, includes so-called PN junctions that are formed by an interface of highly doped drain and source regions with an inversely or weakly doped channel region disposed between the drain region and the source region. These regions are embedded or are formed in a well region, which has an appropriate doping level and profile so as to adjust the basic transistor characteristics, such as threshold voltage and the like. The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on, among other things, the distance between the source and drain regions, which is also referred to as channel length. Therefore, reducing the feature sizes and in particular the gate length (and, thus, the channel length) of the field effect transistors has been an important design criterion.

In addition to other advantages, silicon-on-insulator (SOI) technology has continuously been gaining in importance for manufacturing MOS transistors due to reduced parasitic capacitance of the PN junctions in SOI transistors, thereby allowing higher switching speeds compared to bulk transistors. In SOI transistors, the semiconductor region or active region, in which the drain and source regions as well as the channel region are located, also referred to as the body, is dielectrically encapsulated. This configuration provides significant advantages, but also gives rise to a plurality of issues. Bulk devices have bodies that are electrically connected to the substrate and are maintained at a specified potential when a specified potential is applied to the substrate. Unlike bulk devices, the body or well of SOI transistors is not connected to a specified reference potential, and, hence, the body's potential may usually float due to the accumulation of minority charge carriers, unless appropriate countermeasures are taken.

These floating body effects result in drain current "kink" effect, abnormal threshold slope, low drain breakdown voltage, drain current transients, and noise overshoot. The "kink" effect originates from impact ionization. When an SOI MOSFET is operated at a large drain-to-source voltage, channel electrons cause impact ionization near the drain end of the channel. Holes build up in the body of the device, raising body potential and thereby raising threshold voltage. This increases the MOSFET current causing a "kink" in the current vs. voltage (I-V) curves. It is thus desirable to eliminate floating body effects.

Accordingly, it is desirable to provide improved SOI integrated circuit structures and methods for fabricating SOI integrated circuits that include body contact features that reduce or eliminate the floating body effects and the negative performance consequences that result from the presence thereof. It further is desirable to provide methods for fabricating the same that are relatively inexpensive to implement and have wide applicability across a variety of integrated circuit designs. Furthermore, other desirable features and characteristics of the present disclosure will become apparent from the subsequent detailed description and the appended claims, taken in conjunction with the accompanying drawings and the foregoing technical field and background.

BRIEF SUMMARY

Silicon-on-insulator integrated circuits including body contact structures and methods for fabricating the same are disclosed. In one exemplary embodiment, a method for fabricating a silicon-on-insulator integrated circuit includes providing a silicon-on-insulator substrate that includes a semiconductor layer disposed over an insulating layer, which in turn is disposed over a substrate, forming a plurality of first shallow isolation trenches through the semiconductor layer to expose a portion of the insulating layer therebelow, forming a plurality of second shallow isolation trenches part-way into the semiconductor layer, and implanting conductivity-determining ions beneath the plurality of second shallow isolation trenches. The method further includes filling the plurality of first and second shallow isolation trenches with an insulating material to form plurality of first and second shallow trench isolation structures and forming a gate structure over the semiconductor layer that includes a first portion disposed over and parallel to at least two of the plurality of second shallow trench isolation structures and a second portion disposed in between the at least two of the plurality of second shallow trench isolation structures. No first shallow trench isolation structures are formed in between the at least two of the plurality of second shallow trench isolation structures. Still further, the method includes forming source/drain regions in the semiconductor layer between the at least two of the plurality of second shallow trench isolation structures and forming contact plugs to the gate structure, to the source drain region, and to a body contact region. The body contact region includes a portion of the semiconductor layer between at least one of the plurality of first shallow trench isolation structures and at least one of the plurality of second shallow trench isolation structures.

In another exemplary embodiment, a silicon-on-insulator integrated circuit includes a semiconductor substrate layer, an oxide insulating material layer disposed over the substrate layer, and semiconductor layer formed over the insulating material layer. Formed within the semiconductor layer are a plurality of parallel, spaced apart first shallow trench isolation (STI) structures that extend completely though the semiconductor layer to contact with the oxide insulating material layer. Further formed within the semiconductor layer are a plurality of parallel, spaced apart second STI structures that extend only part-way into the semiconductor layer, for example to a depth of about half the thickness of semiconductor layer. The plurality of second STI structures have doped regions formed therebeneath. At least two of the plurality of second STI structures are provided such that no first STI structures is provided therebetween A plurality of body contact regions are defined in the semiconductor substrate between first and second STI structures. Source/drain regions are defined in the semiconductor substrate between the at least two of the plurality of second STI structures. A gate structure is formed over the plurality of second STI structures and over the source/drain regions. Contact plugs are provided to the body contact regions, to the source/drain regions, and to the gate structure.

In yet another exemplary embodiment, a method for fabricating a silicon-on-insulator integrated circuit includes forming a plurality of first shallow isolation trenches through a semiconductor layer of a silicon-on-insulator semiconductor substrate to expose a portion of an insulating layer therebelow, forming a plurality of second shallow isolation trenches part-way into the semiconductor layer, implanting conductivity-determining ions beneath the plurality of second shallow isolation trenches, and filling the plurality of first and second shallow isolation trenches with an insulating material to form plurality of first and second shallow trench isolation structures. The method further includes forming a gate structure over the semiconductor layer that includes a first portion disposed over and parallel to at least two of the plurality of second shallow trench isolation structures and a second portion disposed in between the at least two of the plurality of second shallow trench isolation structures. No first shallow trench isolation structures are formed in between the at least two of the plurality of second shallow trench isolation structures. Still further, the method includes forming contact plugs to a body contact region of the semiconductor layer. The body contact region includes a portion of the semiconductor layer between at least one of the plurality of first shallow trench isolation structures and at least one of the plurality of second shallow trench isolation structures.

BRIEF DESCRIPTION OF THE DRAWINGS

The present disclosure will hereinafter be described in conjunction with the following drawing figures, wherein like numerals denote like elements, and wherein.

DETAILED DESCRIPTION

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

Embodiments of the present disclosure are generally directed to SOI integrated circuit structures that include a body contact structure, and methods for fabricating the same, which avoid the floating body effect problems encountered in the prior art, such as the above-noted "kink effect." In the described embodiments, at least one gate structure is formed directly over shallow trench isolation structures, as opposed to only between such structures as known in the prior art. This configuration reduces the detrimental gate resistance described above, and thus increases the performance of the SOI integrated circuit.

For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

Figure 1:
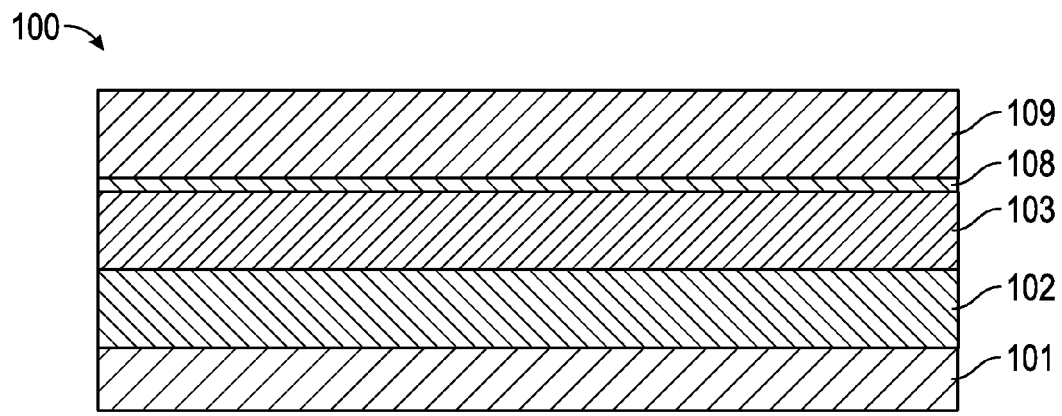
FIGS. 1-6 illustrate, in cross section, integrated circuit structures and methods for fabricating integrated circuits in accordance with various embodiments of the present disclosure.

FIGS. 1-6 illustrate, in cross section, integrated circuit structures and methods for fabricating integrated circuits in accordance with various embodiments of the present disclosure. FIG. 1 schematically illustrates a cross-sectional view of a semiconductor device 100 in a manufacturing phase prior to the formation of any transistor elements of the device 100. As shown, the device 100 is an SOI device including a substrate 101, which may include a crystalline semiconductor material, for example in the form of a silicon or stacked polycrystalline silicon and silicon (not shown) material. Moreover, a buried insulating layer 102, such as a silicon dioxide layer, is formed on the crystalline substrate 101 with an appropriate thickness, for example having a thickness from about 200 to about 5000 Angstroms. Furthermore, a semiconductor layer 103, which may also be referred to as an active semiconductor layer, is formed on the buried insulating layer 102, and may have a thickness from about 500 to about 100,000 Angstroms. FIG. 1, layers 101-103, thus depict a conventional silicon-on-insulator substrate as is well-understood in the art. The silicon-on-insulator substrate may be fabricated according to any of the conventional methods known in the art, such as SIMOX (separation by implantation of oxygen), silicon implant through oxide, or wafer bonding techniques.

With continued reference to FIG. 1, processing of the conventional SOI substrate begins with a layer of oxide 108 that is deposited over the semiconductor layer 103 by, for example, low pressure chemical vapor deposition (LPCVD), to a thickness from about 100 to about 500 Angstroms. This layer 108 is a stress relief layer and is commonly referred to in the art as a "PAD oxide" layer. A hard mask layer 109 is then formed over the oxide layer 108. This layer may include a dielectric material, such as silicon nitride, silicon oxynitride, or the like.

Figure 2:
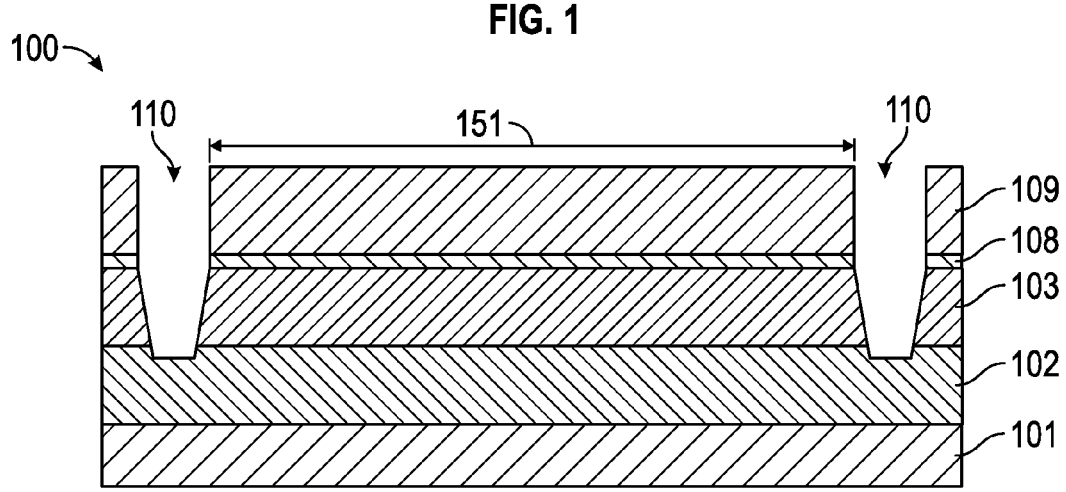

With reference now to FIG. 2, a plurality of first shallow trench isolation (STI) trenches 110 (hereinafter "STI trenches") are formed in the SOI substrate 100 using a suitable patterning, masking, and etching technique. The plurality of first STI trenches 110 are formed through the hard mask layer 109, through the stress relief PAD oxide layer 108, and through the semiconductor layer 103. The insulating oxide layer 102 is used as an "etch stop" layer, that is, the layer at which the plurality of first STI trenches 110 extend to, but not fully through. The plurality of first STI trenches 110 may be formed on the basis of any suitable masking and etching process or processes. For example, in one embodiment, a photoresist material (not illustrated) may be deposited over the hard mask layer, which is then patterned by exposure to a light source using known photolithographic processes. One or more etching steps are then performed to transfer the pattern into the SOI substrate 100, namely into the hard mask layer 109, the stress relief layer 108, and the semiconductor layer 103. The remaining portions of the patterned photoresist layer are then removed (for example by a suitable plasma etch and clean), resulting substantially in the structure illustrated in FIG. 2. The plurality of first STI trenches 110 may be spaced apart from one another by any suitable distance 151 in accordance with the particular integrated circuit design being implemented.

Figure 3:
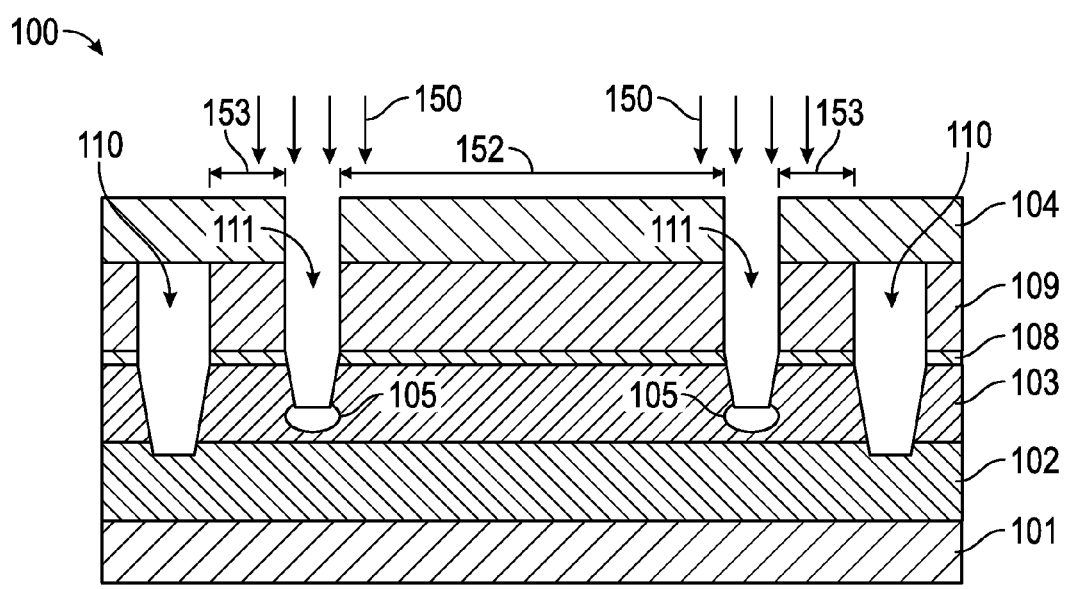

With reference now to FIG. 3, a photolithographic masking layer 104 including, for example, a photoresist material is deposited over the hard mask layer 109, but substantially not within the plurality of first trenches 110. The photolithographic masking layer 104 is then patterned using photolithographic patterning techniques to expose a plurality of openings in the masking layer 104. The plurality of openings in masking layer 104 allows a corresponding plurality of second STI trenches 111 to be formed in the SOI substrate 100. In contrast with the plurality of first STI trenches 110, the plurality of second STI trenches 111 extend only to a depth within the substrate 100 of about half of the thickness of the semiconductor layer 103 (as noted above, first STI trenches 110 extend fully through the layer 103). That is, the plurality of second STI trenches 111 extend through the hard mask layer 109, through the stress relief PAD oxide layer 108, and into, but not fully through, the semiconductor layer 103. As with the plurality of first STI trenches 110, the plurality of second STI trenches 111 may be formed on the basis of any suitable etching process or processes, the masking layer 104 disposed over the plurality of first STI trenches 110 shielding such trenches from further etching. For example, in one embodiment, the photoresist material of layer 104 may be deposited over the hard mask layer 109, which is then patterned by exposure to a light source using known photolithographic processes. One or more etching steps are then performed to transfer the pattern into the SOI substrate 100, namely into the hard mask layer 109, the stress relief layer 108, and the semiconductor layer 103.

As further illustrated in connection with FIG. 3, while the photolithographic masking layer 104 remains in place, but subsequent to the above-described etching to form the plurality of second STI trenches 111, an ion implantation process may be performed (illustrated by ion implantation arrows 150) to implant conductivity-determining ions at the bottom of the plurality of second STI trenches 111. The ions may be of any conductivity-determining type, however, in accordance with an exemplary embodiment, the ions may be of the p-type. Such ions include, but are not limited to, B, Al, In, or Ga. Further, while it is possible to dope the bottom of the STI trenches 111 in a heavy or a light manner, as is known in the art, in one embodiment, the doping is performed in a light manner (i.e., "p-" doping, the "-" symbolizing light doping). The above-mentioned ion implantation process forms, in the particular embodiment described above, a plurality of lightly-doped p-type regions 105 located beneath the plurality of second STI trenches 111, as shown in FIG. 3. Due to the masking layer 104 remaining in place during the ion implantation process, these doped regions are not formed beneath the plurality of first STI trenches 110. The remaining portions of the patterned photoresist layer are then removed (for example by a suitable plasma etch and clean), resulting substantially in the structure illustrated in FIG. 3. The plurality of second STI trenches 111 may be spaced apart from one another by any suitable distance 152 in accordance with the particular integrated circuit design being implemented. In the embodiment shown in FIG. 3, the distance 152 is less than the distance 151. Further, the plurality of second STI trenches 111 may be spaced apart from the plurality of first STI trenches 110 by a distance 153. In the embodiment shown, the distance 153 is less than both distances 151 and 152. The spacing and positioning of the respective STI trenches 110 and 111 may be configured according to a particular integrated circuit design, and should not be viewed as limiting of the present embodiments.

In some alternative embodiments, the sequence of forming the first and second STI trenches 110, 111 may be reversed. That is, the processes described above with regard to FIG. 3 may alternatively be performed before those described above with regard to FIG. 2.

Figure 4:
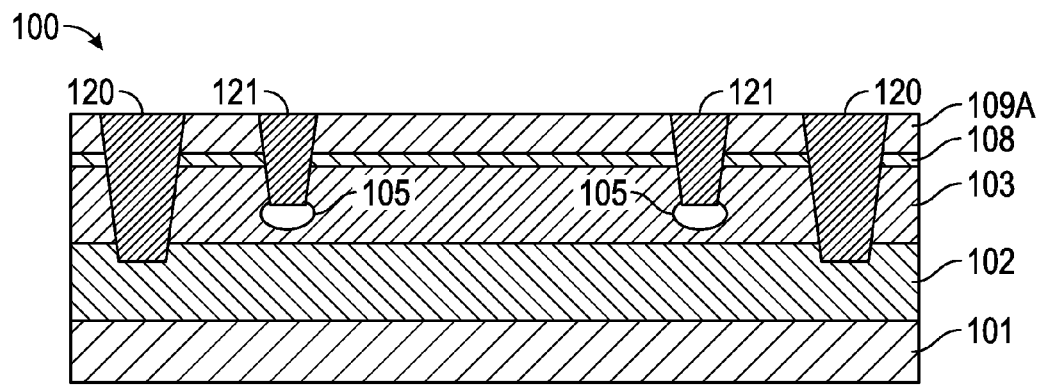

With reference now to FIG. 4, the plurality of first and second STI trenches 110 and 111 are filled with an oxide material to form a plurality of first and second STI structures 120 and 121, respectively. For example, in one embodiment, a liner oxide layer, not shown, first may be grown on the sidewalls and bottom of the STI trenches 110 and 111, such as by LPCVD to a thickness of from about 100 to about 500 Angstroms. Then an oxide layer, such as high density plasma (HDP) oxide may be deposited to fill the trenches 110 and 111, to form the completed STI structures 120 and 121 as shown in FIG. 4. Excess oxide material used to form the STI structures 120 and 121, for example as may be present on top of hard mask layer 109, may thereafter be removed by a suitable etching, polishing, or planarization technique, such as chemical mechanical planarization (CMP). The CMP step may also remove a portion of the hard mask layer 109, which is thus represented in FIG. 4 as hard mask layer 109A having a reduced thickness.

Figure 5:
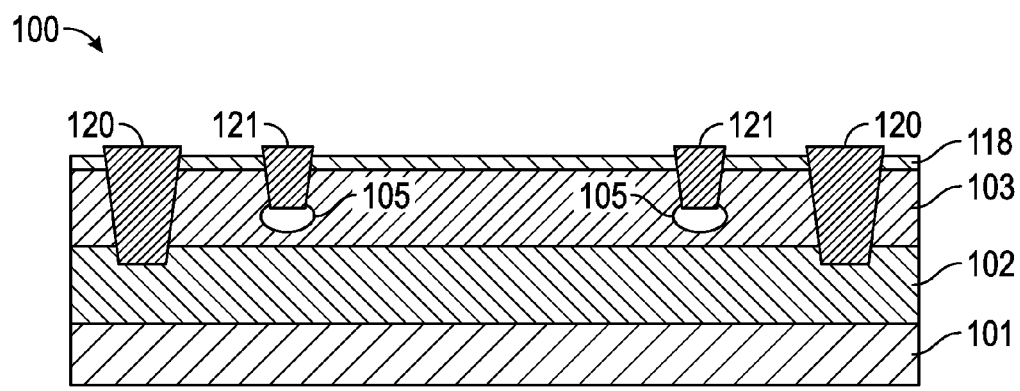

With reference now to FIG. 5, any remaining portions of hard mask layer 109A that were not removed in the previously-described step are then removed using a suitable etching, polishing, or planarization technique, again such as CMP. This CMP step will also reduce the height of the plurality of first and second STI structures 120 and 121. In a further material removal step, the PAD oxide layer 108 is removed using an etching step that is selective to the PAD oxide layer 108, which substantially avoids removal of the STI structures 120 and 121. In place of the PAD oxide layer 108, a sacrificial oxide layer 118 is grown on the semiconductor layer 103 using a suitable oxide growth technique, such as thermal oxidation or epitaxial growth, for example. The resulting structure, as shown in FIG. 5, includes the sacrificial oxide layer 118 grown over the semiconductor layer 103 to a thickness of about 100 Angstroms, for example.

With further reference to FIG. 5, a suitable ion implantation process may thereafter be performed to define one or more well regions within the semiconductor layer 103. As known in the art, in a typical CMOS process, well regions include regions of lightly-doped areas of the semiconductor substrate with conductivity determining ions to define the locations of n-type and p-type semiconductor devices.

Figure 6:
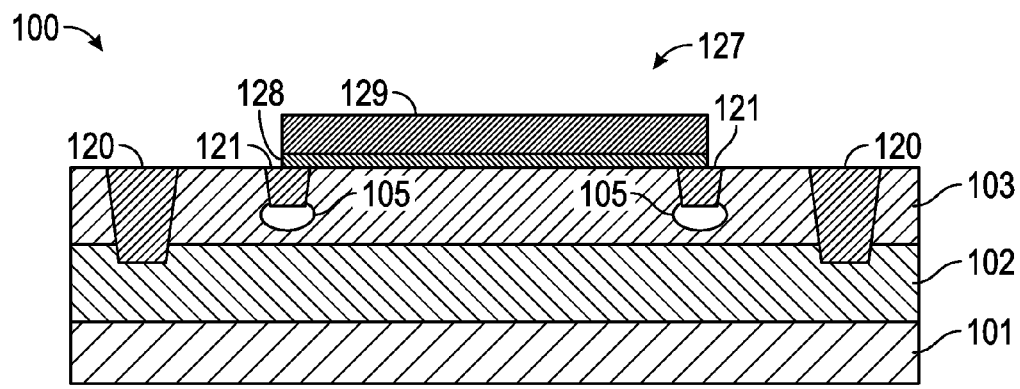

With reference now to FIG. 6, the SOI substrate 100 is subjected to a further cleaning, process in preparation for the formation of a gate structure, contact structures, and the like. As shown, all of sacrificial oxide layer 118 and the upper portions of the plurality of first and second STI structures 120 and 121 are removed in the clean process, which stops on the semiconductor layer 103. As described above, CMP or like may be used in this polishing and/or planarization process.

Figure 7A:
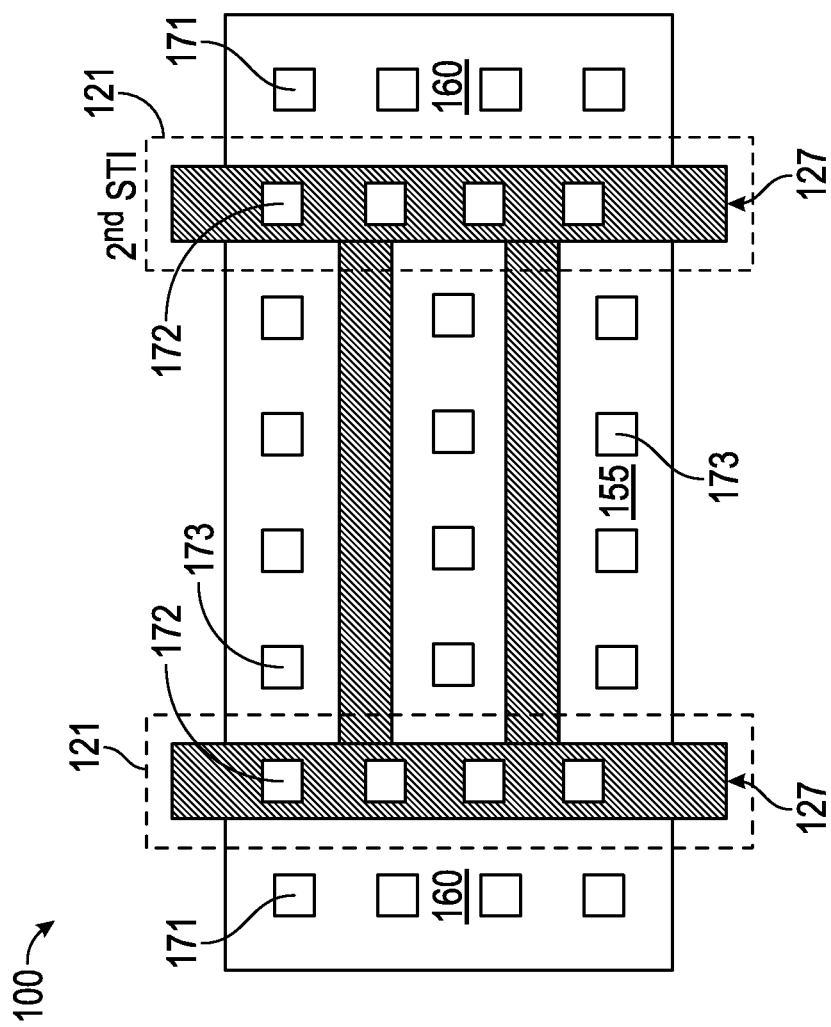
FIGS. 7A and 7B illustrate, in a top view and a perspective view, respectively, a further integrated circuit structure fabricated according to the methods for fabricating integrated circuits illustrated in FIGS. 1-6.
Figure 7B:
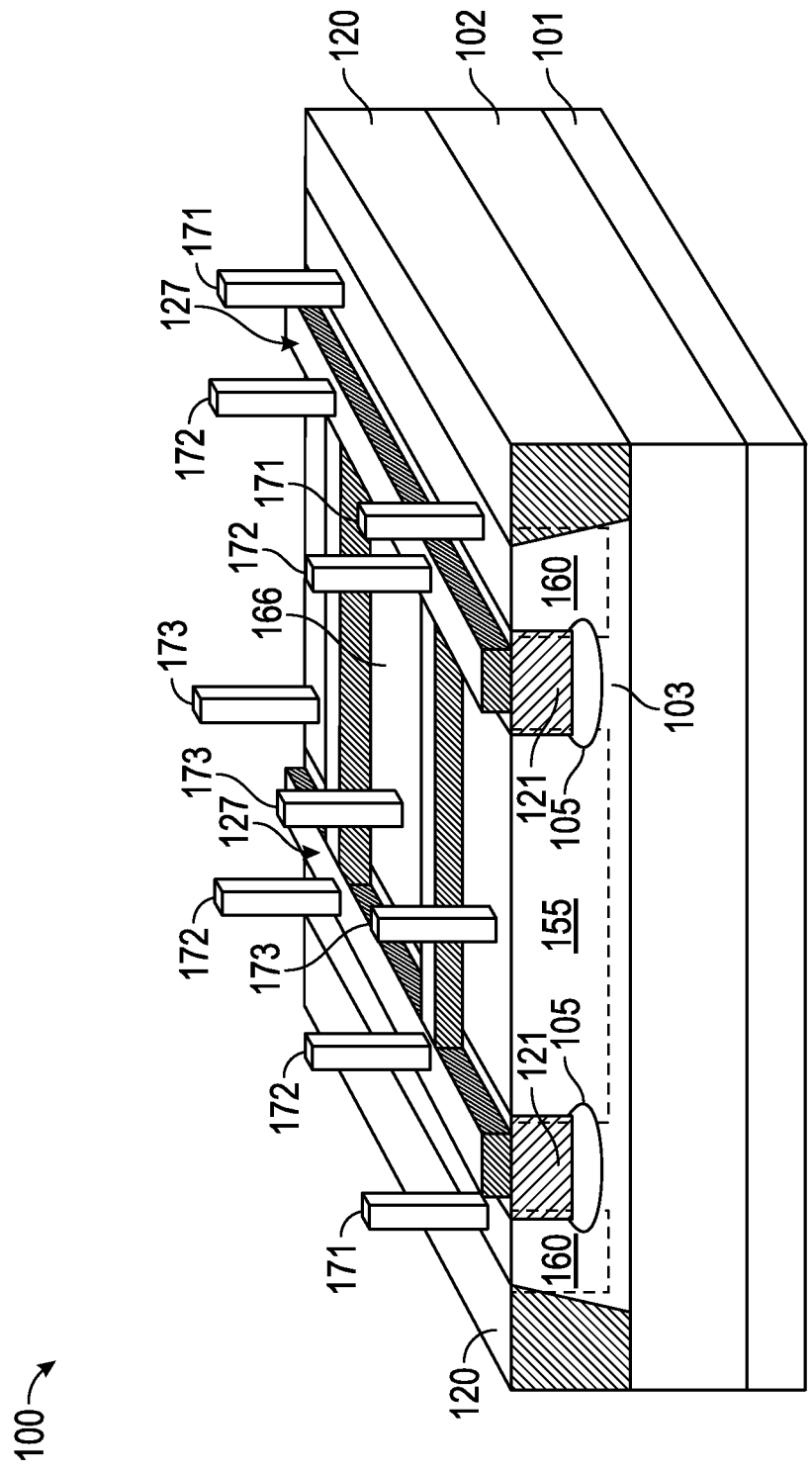

As further shown in FIG. 6, a gate structure 127 is fabricated that includes a gate insulation layer 128 and a conductive gate electrode 129. The gate structure 127 may be formed by forming layers of material that correspond to the gate insulation layer 128 and the gate electrode 129 and thereafter patterning those layers of material using known etching and photolithography techniques. For example, various layers of material that correspond to the gate insulation layer 128 and the gate electrode 129 (and a gate cap layer (not shown)) may be formed above the semiconductor layer 103 by performing one or more deposition and/or thermal growth processes. Thereafter, a patterned masking layer (not shown), such as a photoresist mask, is formed above the various layers of material, and one or more etching processes are performed through the patterned masking layer to define the gate insulation layer 128 and the gate electrode 129. As will be appreciated by one skilled in the art after a complete reading of the present disclosure, the gate structure 127 may be formed using a variety of different materials and by performing a variety of known techniques. For example, the gate insulation layer 128 may include a variety of different insulating materials, e.g., silicon dioxide or a so-called high-k insulating material (k value greater than 3.9). The gate electrode 129 may include polysilicon or it may contain at least one metal layer. The gate structure may be formed in accordance with any shape or design as may be desirable for a particular integrated circuit. As shown in FIG. 6, the gate structure 127 is formed both over and extending between two of the plurality of second STI structures 121 (e.g., approximating distance 152) that do not have any first STI structures 120 therebetween. As such, some portions of the gate structure 127 extending in the direction perpendicular to the drawing page of FIG. 6 extend over and are parallel to the two of the plurality of second STI structures 121, and some portions of the gate structure 127 extending along the plane of the drawing page may extend over the regions between the two of the plurality of second STI structures (the configuration is best illustrated in FIGS. 7A and 7B, described below). These respective portions are perpendicular to one another, and form a generally "H-shaped" configuration."

After formation of the gate structure 127, with reference now to FIG. 7A (top view) and FIG. 7B (perspective view), additional implantation processes may be performed in the conventional manner for CMOS fabrication processes. For example, in one embodiment, a patterned photoresist mask is formed above the semiconductor layer 103 using known photolithography techniques. Thereafter, an initial extension region ion implantation process is performed to form so-called extension implant regions in the semiconductor layer 103. In some cases, the extension implant regions will be self-aligned with respect to the gate structure 127 (e.g., for an NMOS transistor in certain applications). However, in other cases, there may be an offset spacer or liner (not shown) formed on the sidewall of the gate structure 127 prior to performing the extension implant process, and the extension implant regions would be self-aligned with respect to such liner and/or spacer structure. The details of the ion implantation process, such as the material implanted, the implant dose and implant energy, may vary depending on the particular application. In one illustrative embodiment, where the device is an NMOS transistor, the ion implantation process may be a vertical ion implantation process performed using an n-type dopant, e.g., arsenic or phosphorus, at a dopant dose that may be from about $1e^{14}$ to about $5e^{15}$ ions/cm$^2$, at an energy level that may be from about 1 to about 70 keV.

Other conventional implant regions may be formed in a similar manner. For example, a patterned photoresist mask may be formed above the semiconductor layer 103 to form the deep source/drain implant regions 155 for the device 100. That is, in the depicted example, two ion implant processes are performed through the same patterned mask layer to form the deep source/drain regions 155 for the device 100. More specifically, in one illustrative example, a first source/drain ion implantation process is performed to form first source/drain implant regions 155. Thereafter, in this illustrative example, a second source/drain ion implantation process is performed through the same patterned mask layer to form second source/drain implant regions 155. Another possible implantation region that may be formed within layer 103 include so-called "halo" implantation regions. Generally, the embodiments described herein are not understood to be limited by the method, number, or manner of conductivity-determining implantation regions formed in accordance with a particular integrated circuit design.

With continued reference to FIGS. 7A and 7B, a plurality of contact structures may be formed to the semiconductor layer 103 and to the gate structure 127, as will be described in greater detail below. As is known in the art, contact structures generally include vertically-oriented structures formed of a conductive material that contact with features of the integrated circuit to provide electron flow thereto or to withdraw electron flow therefrom in the operation of the integrated circuit. For example, contact structures may be formed to the source/drain regions 155 (S/D contact structures 173), to the gate structure 127 (gate contact structures 172), and to the region 160 of the semiconductor layer between the first and second STI structures 120, 121, which will hereinafter be referred to as the "body contact" region (body contact structures 171), as that term is conventionally used in the art. Contact structures may be formed on the basis of well-known masking, patterning, conductive material deposition, and etching steps. For example, in one embodiment, an interlevel dielectric layer (ILD; not shown) is blanket deposited over the semiconductor layer 103 and the gate structure 127 to a thickness of from about 6000 to about 20,000 Angstroms. The ILD layer may include sub-atmospheric borophosphosilicate glass (BPSG), tetraethoxysilane (TEOS) oxide, fluorinated silicate glass (FSG), and low dielectric constant dielectrics, for example. Contact openings are etched through the ILD layer to the underlying source/drain regions 155, to the gate 127, and/or to the body contact regions 160. A layer of a conductive material, such as tungsten, aluminum, copper, or a combination of two or more thereof is deposited over the ILD layer and within the contact openings. The conducting layer may be etched back to leave contact "plugs" 171-173, as shown in FIGS. 7A and 7B (while excluding illustration of the ILD layer therebetween for clarity of illustration).

Thus, FIGS. 7A and 7B illustrate an embodiment of a SOI integrated circuit that includes a semiconductor substrate layer 101, an oxide insulating material layer 102 disposed over the substrate layer 101, and semiconductor layer 103 formed over the insulating material layer 102. Formed within the semiconductor layer 103 are a plurality of parallel, spaced apart first STI structures 120 that extend completely though the semiconductor layer 103 to contact with the oxide insulating material layer 102. Further formed within the semiconductor layer 103 are a plurality of parallel, spaced apart second STI structures 121 that extend only part-way into the semiconductor layer, for example to a depth of about half the thickness of semiconductor layer 103, and that have doped regions 105, such as lightly-doped p-type regions, formed therebelow. The doped regions 105 serve to improve the body tie with the extrinsic body, and to reduce the body resistance to the channel. At least two of the plurality of second STI structures 121 are provided such that no first STI structure is provided therebetween. A plurality of body contact regions 160 are defined in the semiconductor layer 103 between first and second STI structures 120, 121. Source/drain regions 155 are defined in the semiconductor layer 103 between the at least two of the plurality of second STI structures 121. A gate structure 127 is formed over the plurality of second STI structures 121 and over the source/drain regions 155. Contact plugs (171, 172, and 173, respectively) are provided to the body contact regions 160, to the source/drain regions 155, and to the gate structure 127.

Thereafter, the integrated circuit may be completed using know "middle-of-the-line" (MOL) processes and "back-end-of-the-line" (BEOL) processes. The present disclosure is not intended to exclude any such further processes as are conventional in the fabrication of conventional SOI integrated circuits and semiconductor chips.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration in any way. Rather, the foregoing detailed description will provide those skilled in the art with a convenient road map for implementing the exemplary embodiment or exemplary embodiments. It should be understood that various changes can be made in the function and arrangement of elements without departing from the scope as set forth in the appended claims and the legal equivalents thereof.

What is claimed is:

1. A method for fabricating a silicon-on-insulator integrated circuit comprising:
   providing a silicon-on-insulator substrate that comprises a semiconductor layer disposed over an insulating layer, which in turn is disposed over a substrate;
   forming a plurality of first shallow isolation trenches completely through the semiconductor layer to expose a portion of the insulating layer therebelow;
   forming a plurality of second shallow isolation trenches only part-way, but not fully, through the semiconductor layer;
   subsequent to forming the plurality of second shallow isolation trenches, implanting conductivity-determining ions into the semiconductor layer beneath the plurality of second shallow isolation trenches;
   subsequent to implanting the conductivity-determining ions, filling the plurality of first and second shallow isolation trenches with an insulating material to form a plurality of first and second shallow trench isolation structures;
   forming a gate structure over the semiconductor layer that includes a first portion disposed over and parallel to at least two of the plurality of second shallow trench isolation structures and a second portion disposed in between the at least two of the plurality of second shallow trench isolation structures, wherein no first shallow trench isolation structures are formed in between the at least two of the plurality of second shallow trench isolation structures; and
   forming contact plugs to the gate structure and to a body contact region.

2. The method of claim 1, further comprising forming a PAD oxide layer over the silicon-on-insulator substrate, and wherein forming the plurality of first and second shallow isolation trenches comprises forming the plurality of first and second shallow isolation trenches through the PAD oxide layer.

3. The method of claim 2, further comprising forming a hard mask layer over the PAD oxide layer, and wherein forming the plurality of first and second shallow isolation trenches comprises forming the plurality of first and second shallow isolation trenches through the hard mask layer.

4. The method of claim 3, further comprising planarizing the hard mask layer, subsequent to filling the plurality of first and second shallow isolation trenches, to remove a portion of the hard mask layer and a first portion of the first and second shallow trench isolation structures.

5. The method of claim 1, wherein filling the plurality of first and second shallow isolation trenches with an insulating material comprises filling the plurality of first and second shallow isolation trenches with a high density plasma (HDP) oxide insulating material.

6. The method of claim 1, wherein forming the first and second shallow isolation trenches comprises performing separate etching procedures at different depths.

7. The method of claim 1, wherein forming the contact plugs further comprises forming an interlevel dielectric layer over the silicon-on-insulator substrate and over the gate structure.

8. The method of claim 7, wherein forming the contact plugs further comprises forming a plurality of contact openings etched through the interlevel dielectric layer.

9. The method of claim 8, wherein forming the contact plugs further comprises filling the plurality of contact openings with a conductive material.

10. The method of claim 1, wherein the body contact region comprises a portion of the semiconductor layer between at least one of the plurality of first shallow trench isolation structures and at least one of the plurality of second shallow trench isolation structures.

11. A silicon-on-insulator integrated circuit comprising:
    a semiconductor substrate layer;
    an oxide insulating material layer disposed over the substrate layer;
    a semiconductor layer formed over the insulating material layer;
    within the semiconductor layer, a plurality of parallel, spaced apart first shallow trench isolation (STI) structures, comprising an insulating material, that extend completely though the semiconductor layer to contact with the oxide insulating material layer;

within the semiconductor layer, a plurality of parallel, spaced apart second STI structures, comprising the insulating material, that extend only part-way, but not fully, into the semiconductor layer, wherein at least two of the plurality of second STI structures are provided such that no first STI structures is provided therebetween;

directly beneath the plurality of parallel, spaced apart second STI structures, within the semiconductor layer, and in direct physical contact with a bottom portion of the second STI structures, a plurality of conductivity-determining ion-doped regions;

a plurality of body contact regions in the semiconductor substrate between at least one of the first and at least one of the second STI structures;

source/drain regions in the semiconductor substrate between the at least two of the plurality of second STI structures;

a gate structure having a first portion over the plurality of second STI structures and a second portion over the source/drain regions; and contact plugs to the body contact regions, to the source/drain regions, and to the gate structure.

12. The integrated circuit of claim 11, wherein the oxide insulating material comprises a high density plasma (HDP) oxide.

13. The integrated circuit of claim 11, wherein the gate structure comprises a gate electrode disposed over a gate insulating layer.

14. The integrated circuit of claim 11, wherein the contact plugs comprise a conductive material.

15. The integrated circuit of claim 11, further comprising lightly-doped well regions in the semiconductor substrate between the at least two of the plurality of second STI structures.

16. The integrated circuit of claim 11, further comprising an interlevel dielectric layer over the gate structure and the semiconductor layer, and in between the contact plugs.

17. A method for fabricating a silicon-on-insulator integrated circuit comprising:

providing a silicon-on-insulator substrate that comprises a semiconductor layer disposed over an insulating layer, which in turn is disposed over a substrate;

forming a plurality of first shallow isolation trenches completely through the semiconductor layer to expose a portion of the insulating layer therebelow;

forming a plurality of second shallow isolation trenches only part-way, but not fully, through the semiconductor layer;

subsequent to forming the plurality of second shallow isolation trenches, implanting conductivity-determining ions into the semiconductor layer beneath the plurality of second shallow isolation trenches;

subsequent to implanting the conductivity-determining ions, filling the plurality of first and second shallow isolation trenches with an insulating material to form a plurality of first and second shallow trench isolation structures;

forming a gate structure over the semiconductor layer that includes a first portion disposed over and parallel to at least two of the plurality of second shallow trench isolation structures and a second portion disposed in between the at least two of the plurality of second shallow trench isolation structures;

forming contact plugs to the gate structure and to a body contact region;

forming lightly-doped well regions in the silicon-on-insulator substrate after forming the first and second shallow trench isolation structures but prior to forming the gate structure; and forming source/drain regions in the semiconductor layer adjacent the second portion of the gate structure and between the at least two of the plurality of second shallow trench isolation structures, wherein forming the source/drain regions is performed subsequent to forming the gate structure but prior to forming the contact plugs.

* * * * *